United States Patent
Klimczak et al.

(10) Patent No.: US 12,322,570 B2
(45) Date of Patent: Jun. 3, 2025

(54) PULSING ASSEMBLY AND POWER SUPPLY ARRANGEMENT

(71) Applicant: TRUMPF Huettinger Sp. z o. o., Zielonka (PL)

(72) Inventors: Andrzej Klimczak, Warsaw (PL); Andrzej Gieraltowski, Warsaw (PL); Michal Balcerak, Marki (PL)

(73) Assignee: TRUMPF HUETTINGER SP. Z O. O., Zielonka (PL)

( * ) Notice: Subject to any disclaimer, the term of this patent is extended or adjusted under 35 U.S.C. 154(b) by 173 days.

(21) Appl. No.: 18/160,315

(22) Filed: Jan. 27, 2023

(65) Prior Publication Data
US 2023/0170184 A1    Jun. 1, 2023

Related U.S. Application Data

(63) Continuation of application No. PCT/EP2021/071165, filed on Jul. 28, 2021.

(30) Foreign Application Priority Data

Jul. 29, 2020   (EP) ..................... 20461554

(51) Int. Cl.
H01J 37/00   (2006.01)
H01J 37/32   (2006.01)
H02J 7/34   (2006.01)

(52) U.S. Cl.
CPC ... H01J 37/32009 (2013.01); *H01J 37/32146* (2013.01); *H01J 2237/327* (2013.01); *H02J 7/345* (2013.01)

(58) Field of Classification Search
CPC .... H02J 9/02; H02J 1/06; H02J 7/345; H02M 3/335; H02M 1/10; H01J 2237/327; H01J 37/32146; H01J 37/3467
See application file for complete search history.

(56) References Cited

U.S. PATENT DOCUMENTS 4,555,754 A   11/1985 Hennevin
4,670,667 A   6/1987 Petit
(Continued)

FOREIGN PATENT DOCUMENTS

CN   203504399 U   3/2014
CN   105356779 A   2/2016
(Continued)

OTHER PUBLICATIONS

L.M. Redondo et al, "All Silicon Marx-bank Topology for High-voltage, High-frequency Rectangular Pulses," Annual IEEE Conference on Power Electronics Specialists (PESC), Jun. 2005, pp. 1170-1174, IEEE, Dresden, Germany.
(Continued)

*Primary Examiner* — Tuan T Lam
(74) *Attorney, Agent, or Firm* — LEYDIG, VOIT & MAYER, LTD.

(57) ABSTRACT

A pulsing assembly for delivering power to a plasma reactor having a first load between a first plasma reactor input port and a plasma reactor common port and having a second load between a second plasma reactor input port and the plasma reactor common port. The pulsing assembly includes a first pulsing unit, a second pulsing unit and an energy storage component connected therebetween. The first pulsing unit includes a first input port connectable to a power source, a pulsing assembly common port connectable to the plasma reactor common port, a first output port connectable to the first load of the plasma reactor for supplying pulses between the first output port and the pulsing assembly common port. The second pulsing unit includes a second input port connectable to a power source and a second output port connectable to the second load of the plasma reactor.

14 Claims, 3 Drawing Sheets

(56) References Cited

U.S. PATENT DOCUMENTS

| | | | |
|---|---|---|---|
| 5,286,360 | A | 2/1994 | Szczyrbowski et al. |
| 5,969,964 | A | 10/1999 | Mangtani |
| 6,096,174 | A | 8/2000 | Teschner et al. |
| 6,488,807 | B1 | 12/2002 | Collins et al. |
| 6,859,087 | B2 | 2/2005 | Galli et al. |
| 6,963,498 | B2 | 11/2005 | Nadd |
| 8,536,929 | B2 | 9/2013 | Bergmann |
| 8,962,488 | B2 | 2/2015 | Liao et al. |
| 10,347,500 | B1 | 7/2019 | Doh et al. |
| 2001/0017783 | A1 | 8/2001 | Bruckmann et al. |
| 2002/0004309 | A1 | 1/2002 | Collins et al. |
| 2004/0055881 | A1 | 3/2004 | Christie |
| 2004/0124077 | A1* | 7/2004 | Christie ............ H01J 37/34 204/192.12 |
| 2010/0248488 | A1 | 9/2010 | Agarwal et al. |
| 2012/0038677 | A1 | 2/2012 | Hiroi et al. |
| 2014/0232266 | A1* | 8/2014 | Finley ............ H01J 37/34 315/111.21 |
| 2015/0268486 | A1 | 9/2015 | Edler |
| 2016/0043546 | A1 | 2/2016 | Lendi |
| 2016/0203958 | A1 | 7/2016 | Arase et al. |
| 2018/0358213 | A1 | 12/2018 | Ruzic et al. |
| 2019/0088521 | A1 | 3/2019 | Chua et al. |
| 2019/0088522 | A1 | 3/2019 | Lindley et al. |
| 2019/0198298 | A1 | 6/2019 | Hirose et al. |
| 2020/0411288 | A1* | 12/2020 | Wang ............ H01J 37/32935 |
| 2022/0415614 | A1* | 12/2022 | Yang ............ H01J 37/32174 |

FOREIGN PATENT DOCUMENTS

| | | |
|---|---|---|
| CN | 105406722 B | 10/2018 |
| DE | 19651811 A1 | 6/1998 |
| DE | 102012222606 A1 | 6/2014 |
| DE | 102013212099 A1 | 1/2015 |
| DE | 102016223314 A1 | 5/2018 |
| EP | 0553410 A1 | 8/1993 |
| EP | 2533411 A1 | 12/2012 |
| FR | 2547106 A1 | 12/1984 |
| JP | H 06197522 A | 7/1994 |
| JP | H 0767320 A | 3/1995 |
| JP | 2003129234 A | 5/2003 |
| JP | 2010116578 A | 5/2010 |
| WO | WO 2005005684 A1 | 1/2005 |
| WO | WO 2008071732 A1 | 6/2008 |
| WO | WO 2010116578 A1 | 10/2010 |
| WO | WO 2016026790 A2 | 2/2016 |
| WO | WO 2019049158 A1 | 3/2019 |
| WO | WO 2019212592 A1 | 11/2019 |

OTHER PUBLICATIONS

Ahmed Abbas Elserougi et al; "Conceptual Study of a Bipolar Modular High-Voltage Pulse Generator with Sequential Charging," IEEE Transactions on Dielectrics and Electrical Insulation 23(6), Dec. 2016, pp. 1-8, IEEE, Piscataway, New Jersey, United States.

C. Gerster, "Fast high-power/high-voltage switch using series-connected IGBTs with active gate-controlled voltage-balancing," Proceedings of 1994 IEEE Applied Power Electronics Conference and Exposition—ASPEC'94, Feb. 1994, pp. 469-472, IEEE, Orlando, FL, USA.

D Gahan et al, "Ion energy distribution measurements in rf and pulsed dc plasma discharges," Plasma Sources Science and Technology, Apr. 2012, pp. 1-4, vol. 21, No. 4, IOP Publishing Ltd, Bristol, United Kingdom.

Y. H. Man et al, "Influence of plasma condition on carbon nanotube growth by rf-PECVD," Nano-Micro Letters, 2010, pp. 37-41, Springer Link, Berlin, Germany.

Hiren Canacsinh et al, "Isolated Autonomous Capacitive Power Supplies to Trigger Floating Semiconductors in a Marx Generator," 2007 IEEE International Symposium on Industrial Electronics, Jun. 2007, pp. 1-6, IEEE, Vigo, Spain.

J. Saiz, "Optimisation and integration of an active clamping circuit for IGBT series association," Conference Record of the 2001 IEEE Industry Applications Conference. 36th IAS Annual Meeting (Cat. No.01CH37248), Sep. 2001, pp. 1046-1051, IEEE, Chicago, IL, USA.

Soonwook Hong et al, "Series connection of IGBT's with active voltage balancing," IEEE Transactions on Industry Applications, Aug. 1999, pp. 917-923, vol. 35, Issue 4, IEEE, Piscataway, New Jersey, United States.

Shiqi Ji et al,"Series-connected HV-IGBTs using active voltage control with status feedback circuit," 2014 IEEE Energy Conversion Congress and Exposition (ECCE), Sep. 2014, pp. 710-715, IEE, Pittsburgh, PA, USA.

The Van Nguyen et al, "Series connection of IGBT," 2010 Twenty-Fifth Annual IEEE Applied Power Electronics Conference and Exposition (APEC), Feb. 2010, pp. 2238-2244, IEEE, Palm Springs, CA, USA.

M.A. Huque et al, "Silicon-on-insulator-based high-voltage, high-temperature integrated circuit gate driver for silicon carbide-based power field effect transistors" , IET Power Electronics, Nov. 2010, pp. 1001-1009, vol. 3, Issue 6, The Institution of Engineering and Technology, London, England.

* cited by examiner

PULSING ASSEMBLY AND POWER SUPPLY ARRANGEMENT

CROSS REFERENCE TO RELATED APPLICATIONS

This application is a continuation of International Application No. PCT/EP2021/071165 (WO 2022/023422 A1), filed on Jul. 28, 2021, and claims benefit to European Patent Application No. EP 20461554.6, filed on Jul. 29, 2020. The aforementioned applications are hereby incorporated by reference herein.

FIELD

The invention relates to a pulsing assembly for delivering power to a plasma reactor.

A further aspect of the invention relates to a power supply arrangement having a pulsing assembly.

A further aspect of the invention relates to a method of supplying power to a plasma reactor using a pulsing assembly.

BACKGROUND

It is known, see for example WO 2019 212592 A1, to supply different parts of a plasma reactor with power by dedicated power supplies. This is the most intuitive solution but also the most expensive one. The different parts of the plasma reactor are loads of the plasma reactor.

If high voltages in the range of 1 kV or higher, in particular in the range of 3 kV or higher, are required, the power supplies capable of delivering such voltages and the electrical components that have to be used become increasingly expensive. The same is true for power delivery cables between the power supplies and the plasma reactor.

SUMMARY

In an embodiment, the present disclosure provides a pulsing assembly for delivering power to a plasma reactor having a first load between a first plasma reactor input port and a plasma reactor common port and having a second load between a second plasma reactor input port and the plasma reactor common port. The pulsing assembly comprising a first pulsing unit, a second pulsing unit and an energy storage component connected between the first pulsing unit and the second pulsing unit. The first pulsing unit includes a first input port connectable to a first power source, a pulsing assembly common port connectable to ground and/or to the plasma reactor common port, and a first output port connectable to the first load of the plasma reactor for supplying pulses between the first output port and the pulsing assembly common port. The second pulsing unit includes a second input port connectable to the first power source or a second power source and a second output port connectable to the second load of the plasma reactor for supplying pulses between the second output port and the pulsing assembly common port.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
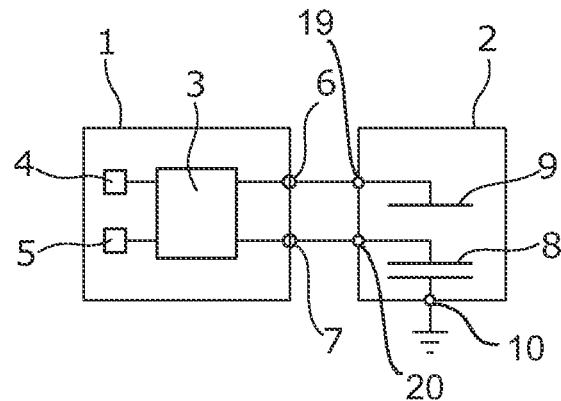
FIG. 1 shows a schematic representation of a power supply arrangement supplying power to a plasma reactor.

It is an aspect of the present invention to provide a cheap assembly capable of delivering high voltages, in particular high voltage pulses, to different parts of a plasma reactor.

The invention relates to a pulsing assembly for delivering power to a plasma reactor, with a first load between a first plasma reactor input port and a plasma reactor common port and with a second load between a second plasma reactor input port and the plasma reactor common port, the pulsing assembly comprising:
  a first pulsing unit comprising:
  a first input port connectable, in particular configured to be connected, to a power source,
  a pulsing assembly common port, connectable to ground and/or to the plasma reactor common port,
  a first output port connectable, in particular configured to be connected, to the first load of the plasma reactor for supplying pulses, in particular voltage pulses, between the first output port and the pulsing assembly common port, deliverable to the first load of the plasma reactor,
  a second pulsing unit comprising:
  a second input port connectable, in particular configured to be connected, to a power source,
  a second output port connectable, in particular configured to be connected, to a second load of the plasma reactor for supplying pulses, in particular voltage pulses, between the second output port and the pulsing assembly common port, deliverable to the second load of the plasma reactor,
  an energy storage component, preferably a capacitor, connected between the first pulsing unit and the second pulsing unit.

A pulsing unit in the meaning of this disclosure may be any kind of unit which is able and in particular configured to deliver electrical energy in form of pulses, such as voltage pulses, current pulses or power pulses. This may be done by electrical switches such as transistors, connected to a control configured to switch the switches on and off or by other electrical circuity.

This configuration allows using a high voltage power supply and a low voltage power supply as power sources. This configuration allows further having high voltage pulses at both outputs with the usage of the high voltage power supply and the low voltage power supply as power sources. The voltage of the low voltage power supply may be shifted using the energy storage component. In particular, a bootstrap topology may be used to shift the voltage of the low voltage power supply. The first pulsing unit can be used to generate high voltage pulses for a first load in the plasma reactor. The second pulsing unit may be used to also supply high voltage pulses using low voltage components to a second load of the plasma reactor.

High voltages (HV) in the meaning of this disclosure may be in the range of 1 kV or higher, in particular in the range of 3 kV or higher.

Low voltages in the meaning of this disclosure may be below 1 kV, in particular in the range of 500 V or below.

A port in the meaning of this disclosure may be any kind of electrical connection assembly such as a plug, connector, terminal, pin, branch, hookup, etc.

The first load may be a working area and the second load may be an additional part of the plasma reactor. The working area may be the area where the target or the substrate of the plasma process is placed. An additional part may be a part which helps to ignite or form the plasma or give the plasma process a direction such as an additional anode or cathode, a shielding, bias etc.

The impedances of the first load may have a capacitive part.

The impedances of the second load may have a capacitive part.

The impedances of the first load may have a resistive part.

The impedances of the second load may have a resistive part.

The energy storage component may be connected between the output of the first pulsing unit and the second pulsing unit. Thus, the potential of the second pulsing unit can be shifted effectively.

The second pulsing unit may have a second pulsing unit common port. This second pulsing unit common port may be connected to the first output port of the first pulsing unit. In this way the second pulsing unit may be able to generate pulses on top of the pulses of the first pulsing unit.

The second pulsing unit may be connected with its second pulsing unit common port to one end of the energy storage component.

The second pulsing unit may be connected with both ends to the energy storage component.

The pulsing assembly may be configured to deliver energy from the first input port to the first output port during a first pulsing time period, in particular deliver pulse energy to the first output port. During the first pulsing time period the first load can be supplied with high voltage pulses.

The pulsing assembly may be configured to charge the energy storage component with energy, preferably from a power source connected to the second input port, during a second pulsing time period. The second pulsing time period may be a time period in which the first load is not supplied with pulse energy. The first pulsing time period and the second pulsing time period may alternate.

The pulsing assembly may be configured to deliver energy from the energy storage component to the second output port during a third pulsing time period. Thus, it is possible to provide a voltage pulse at the second output port that is higher than the input voltages. The energy storage component may be charged to the voltage of the second power source and the potential of the energy storage component may be shifted to the voltage of the first voltage source. Thus, a high voltage can be supplied to the second load. In particular, a voltage can be supplied to the second load the absolute value of which is higher than the absolute value of the voltage of each power source.

In particular, the pulsing assembly may be configured to provide a voltage pulse measured to the pulsing assembly common port and/or ground at at least one of the output ports that is higher than the output voltages of each of the pulsing units.

The third pulsing time period may be synchronized with the first pulsing time period and, preferably, start with or after the start of the first pulsing time period and, preferably, end with or before the end of the first pulsing time period. The third pulsing time period may be the time period during which the first load is supplied with pulse energy. During the second pulsing time period the energy storage component may be charged. During the first pulsing time period, the voltage at the first output is lifted up and then the third pulsing time period can start and energy from the energy storage component can be transferred to the second load. The third pulsing time period should take place during first pulsing time period. However, it is also possible for the third pulsing time period to be completely independent of the first and second pulsing time periods. Hence the first and third pulsing time periods may be synchronized or asynchronous.

A charging circuit may be provided for charging the energy storage component. Thus, the charging becomes more efficient.

The first pulsing unit may comprise a high side switch connected to, preferably between, the first input port and the first output port. Also, the second pulsing unit may comprise a high side switch connected to, preferably between, the energy storage component and/or the second input port and second output port.

The first pulsing unit may also comprise a low side switch connected to the first output port and a common port of the first pulsing unit which is preferably connectable to ground. Ground can be connected to protection earth and/or a shield.

The second pulsing unit may comprise a low side switch connected to the second output port and the first output port.

A rectifying component, preferably a diode, may be provided between the energy storage component and the second input port. Thus, the second power source can be disconnected from the energy storage component during pulse generation.

The rectifying component may be provided between the second input port and the high side switch of the second pulsing unit. Thus, the second power source can be disconnected from the second pulsing unit during pulse generation.

The switches in the first pulsing unit and a rectifying component may be the only high voltage components of the pulsing assembly. All other components may be low voltage components.

Both pulsing units may comprise a series connection of a high side switch and a low side switch. The low side switch of second pulsing unit may be connected between the second output port and the first output of the first pulsing unit. This configuration allows both pulsing units to provide voltage pulses at their outputs.

The high side switch of the first pulsing unit and the high side switch of the second pulsing unit are configured to be switched in a synchronized manner, in particular simultaneously, on and/or off. Synchronous switching allows for high efficiency and low power losses.

A control may be provided for the switches in order to control the switching of the switches and thus also the charging and discharging of the energy storage component.

The pulsing assembly may be configured to provide a voltage pulse at the second output port measured to the pulsing assembly common port and/or ground that has a higher amplitude than the voltages of each pulse unit respectively.

The invention also relates to a power supply arrangement for supplying power to a plasma reactor, the power supply arrangement may comprise:
  one of a first power source,
a first power source and a second power source,
an inventive pulsing assembly.

The power sources may be coupled, i.e. not be independent. The output power of the power sources can be combined. The power sources may be different, in particular a high and low voltage power source. Such an arrangement needs fewer high voltage (HV) components. The plasma reactor may be configured for etching or deposition.

HV components in the meaning of this disclosure may be components configured to be used in the range of 1 kV or higher, in particular in the range of 3 kV or higher.

The first and/or second power source may be a DC power source. The voltage of second power source may be lower than voltage of first power source.

The invention also relates to a method of supplying power to a plasma reactor with a first load between a first plasma reactor input port and a plasma reactor common port and with a second load between a second plasma reactor input port and the plasma reactor common port, using a pulsing assembly, in particular a pulsing assembly according to the invention, comprising the method steps:
  delivering energy from a first input port to the first load via a first output port of a first pulsing unit of the pulsing assembly during a first pulsing time period,
  charging an energy storage component connected between the first pulsing unit and a second pulsing unit of the pulsing assembly with energy, preferably from a power source connected to a second input port of the second pulsing unit during a second pulsing time period,
  delivering energy from the energy storage component to the second load via a second output port of the second pulsing unit during a third pulsing time period.

During the third pulsing time period the absolute value of the voltage at the second output port to ground may be higher than the voltages at each of the input ports. The voltages at the input ports may be equal or different. If the voltages are equal, there may be only one voltage source. The voltage at the first input port may be higher than voltage at second input port. Furthermore, the voltage at the second output port may be higher than voltage at the first output port by the voltage of the storage component.

The first pulsing unit connected to the first power source may be used to shift the potential of the energy storage component.

The second pulsing unit and the energy storage component may be used to provide the voltage to the second plasma reactor load.

The absolute value of the voltage of the pulses at the first output port relative to a common port of the first pulsing unit and/or the pulsing assembly common port may be higher than the absolute value of the voltage of the pulses at the second output port relative to the first output port.

The third pulsing time period may correspond to the first pulsing time period or may be part of the first pulsing time period. In other words: the third pulsing time period may be synchronized with the first pulsing time period and, preferable start with or after the start of the first pulsing time period and, preferably end with or before the end of the first pulsing time period.

During a fourth pulsing time period the same voltage may be delivered to the first and second output port, in particular energy may be delivered from the first input port to both the first and second output ports.

During a fifth pulsing time period no energy may be delivered to the first output port and energy may be delivered from the second input port to the second output port.

During a sixth pulsing time period no energy may be delivered to any of output ports.

During the second, fifth or sixth pulsing time period energy from the second input port may be delivered to the energy storage component.

FIG. 1 shows a power supply arrangement 1 connected to a plasma reactor 2. The plasma reactor 2 may be a plasma chamber. Inside the plasma reactor 2 a substrate can be processed. Either a layer of the substrate can be etched, or a layer can be deposited on the substrate.

The power supply arrangement 1 comprises a pulsing assembly 3 connected to two power sources 4, 5 and has two power outputs 6, 7, which are connected to a first load 8 and a second load 9 of the plasma reactor 2. The first load 8 is connected between a first plasma reactor input port 20 and a plasma reactor common port 10. The second load 9 is connected between a second plasma reactor input port 19 and the plasma reactor common port 10. The plasma reactor 2 is connected to ground via the plasma reactor common port 10. The impedances of the first load 8 and the second load 9 may have a capacitive part. Therefore, they are drafted in the form of capacitors. The impedances may also have a resistive part, as they are dissipating energy.

Figure 2:
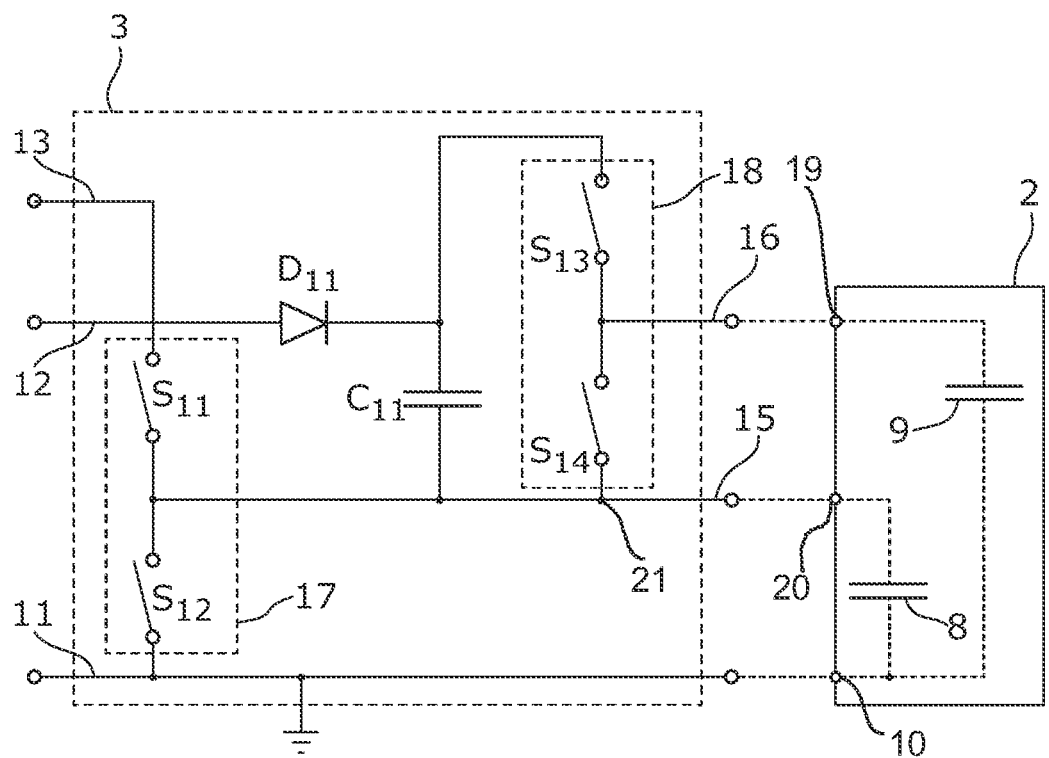
FIG. 2 shows a first embodiment of a pulsing assembly.

FIG. 2 shows a first embodiment of a pulsing assembly 3. The pulsing assembly 3 has a first pulsing unit 17 comprising a high side switch S11 and a low side switch S12. The switches S11, S12 are connected in series. The first pulsing unit 17 is connected to a pulsing assembly common port 11 and a first input port 13. The first input port 13 and the pulsing assembly common port 11 are configured to be connected to the first power source 4. The pulsing assembly common port 11 is connected to ground.

The pulsing assembly 3 furthermore has a second pulsing unit 18 comprising a high side switch S13 and a low side switch S14. The switches S13, S14 are connected in series. The second pulsing unit 18 is connected to an output port 15 of the first pulsing unit 17 and a second input port 12 via a rectifying component D11 embodied as a diode. The second input port 12 is configured to be connected to the second power source 5. The pulsing assembly common port 11 is also configured to be connected to the second power source 5.

The second pulsing unit 18 has a second pulsing unit common port 21. This second pulsing unit common port 21 is connected to the first output port 15 of the first pulsing unit 17. In this way the second pulsing unit 18 may be able to generate pulses on top of the pulses of the first pulsing unit 17.

The output port 15 of the first pulsing unit 17 is connected to the connection point of the switches S11, S12. The output port 15 is configured to be connected to the first load 8 of the plasma reactor 2, in particular via the output port 7 of the power supply arrangement 1 (output port 15 of the first pulsing unit 17 is connected to the output 7 of the power supply arrangement 1).

The second pulsing unit 18 also comprises an output port 16, which is connected to the connection point of the switches S13, S14. The output port 16 is configured to be connected to the second load 9 of the plasma reactor 2, in particular via the output port 6 of the power supply arrangement 1 (output port 16 of the second pulsing unit 18 is connected to the output 6 of the power supply arrangement 1).

An energy storage component C11, in this case embodied as capacitor, is connected with one end to the second pulsing unit common port 21 and to the output port 15 and with its other end to the high side switch S13 and/or to input port 12 of the second pulsing unit 18 by rectifying component D11, in particular the cathode of a diode.

When switch S12 is switched on, the capacitive load 8 is discharged. At the same time the energy storage component C11 is charged to the voltage between ports 12 and 11 by rectifying component D11 and switch S12. This corresponds to a second pulsing time period. Usually, the voltage at the output port 16 should change in the same way as the voltage on the capacitive load 9, therefore switch S14 in the second pulsing unit 18 may be operated together with switch S12. Capacitive load 9 is discharged by switches S14 and S12. In order to supply the load 8 with the voltage of first input port 13, the switch S11 is switched on (and switch S12 is switched off). The load 8 is then charged to the voltage at input port 13 by switch S11. At the same time the lower potential of energy storage component C11 is shifted up to the same voltage as at the output port 15 and thus the load 8. Load 9 is charged by switch S13 to the sum of voltages at C11 (which is equal to the voltage at port 12) and port 15 (which is equal to the voltage on port 13). Therefore load 8 is charged to a voltage higher than the output voltage of power source 4.

Figure 3:
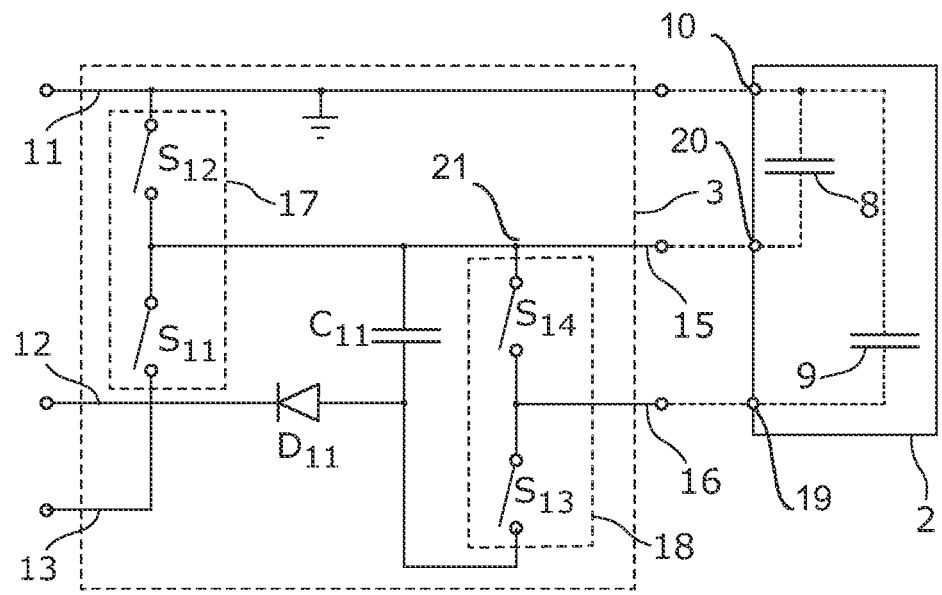
FIG. 3 shows a second embodiment of a pulsing assembly.

FIG. 3. shows a second embodiment of a pulsing assembly 3, which corresponds to the pulsing assembly of FIG. 2. Therefore, the same reference signs are being used. The only difference is that the polarity of the power sources 4, 5 is reversed. So, here, the energy storage component C11, in this case also embodied as capacitor, is connected to the rectifying component D11, in particular the anode of a diode.

Figure 4:
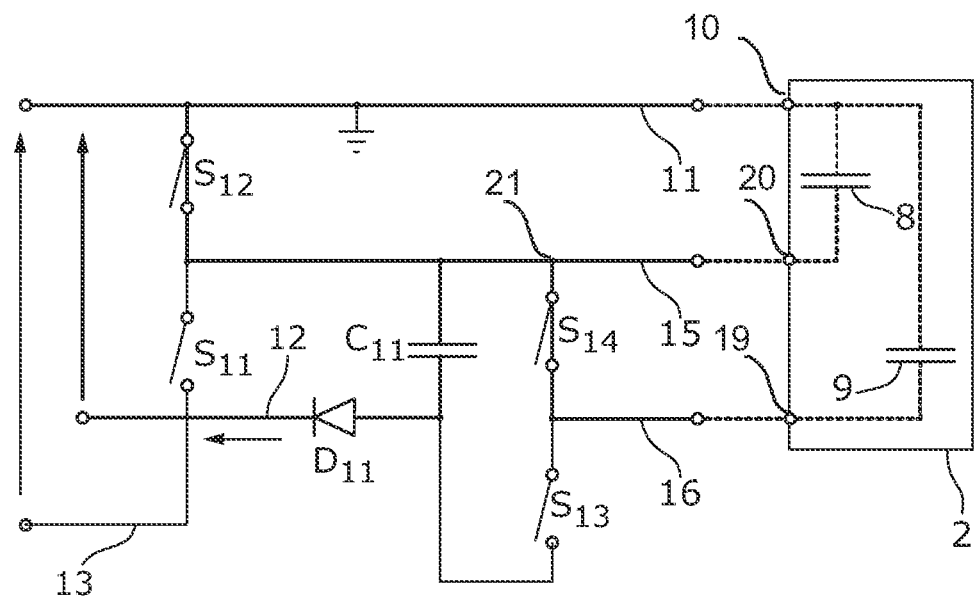
FIG. 4 shows a circuit diagram showing the charging of an energy storage component while no energy is delivered to any of output ports.

FIG. 4 shows in bold lines current paths for the state of discharging the capacitive loads 8, 9 of plasma reactor 2. To this end the switches S12 and S14 are closed and switches S11 and S13 are open. At the same time energy storage component C11 is charged via rectifying component D11 and switch S12 to the voltage at input port 12. This state corresponds to a second pulsing time period.

Figure 5:
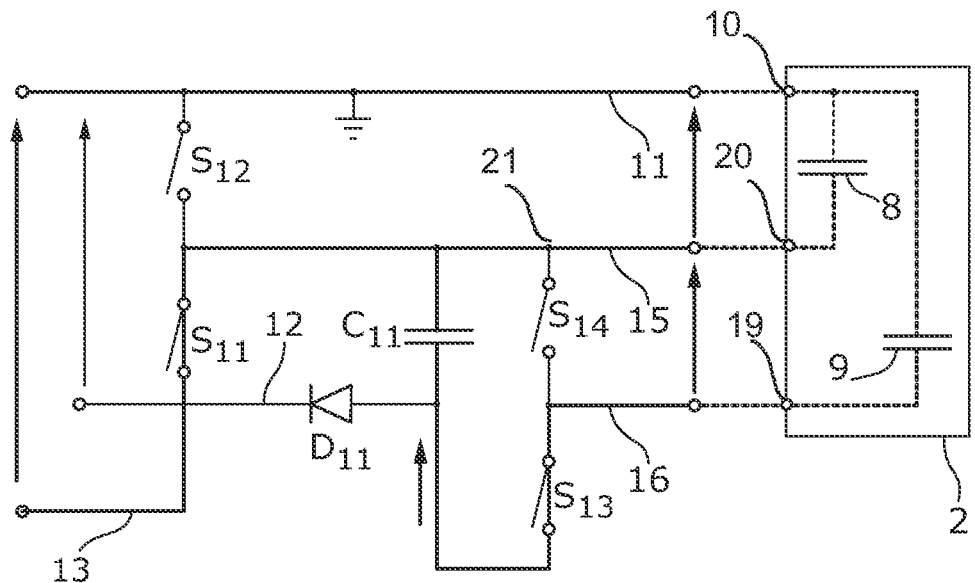
FIG. 5 shows a circuit diagram showing the generation of high voltage pulses on both output ports.

FIG. 5 shows in bold lines the current paths for the state of pulse generation. Capacitive load 8 is charged via switch S11 to the voltage at input port 13. Load 9 is charged to voltage at output port 16 by switch S13. Energy for this charging comes from power source 4 and energy storage component C11, whose higher electrode is connected to output port 15. Rectifying component D11 is in blocking state, so voltage source 5 is disconnected from the circuit by this rectifying component. The situation shown in FIG. 5 corresponds to the first and third pulsing time period.

Figure 6:
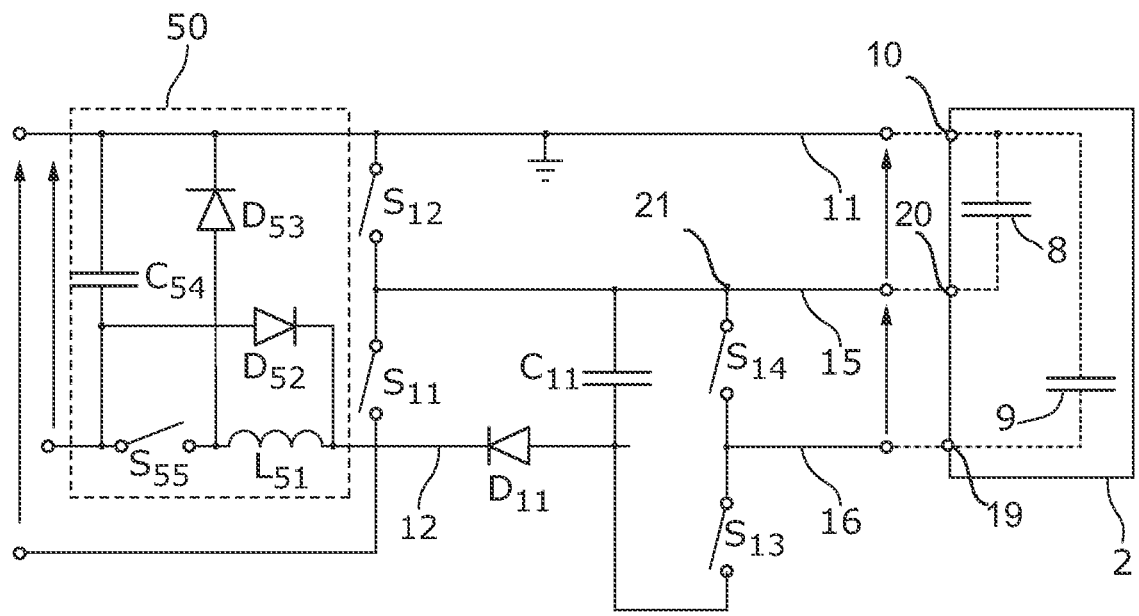
FIG. 6 shows a pulsing assembly having a charging circuit.

FIG. 6 shows an embodiment of a pulsing assembly having a charging circuit 50 connected between second input port 12 and the second pulsing unit 18. When switches S12 and S55 are closed and switches S11 is open, the energy storage component C11 is charged to a voltage of C54 while the charging current is limited by L51, and no voltage is at the output port 15.

When C11 is charged to the voltage of C54 it will not be overcharged by L51 due to D52 and D53. At the first moment, D52 will short circuit L51, which will close the loop of the current of L51. Then, if S55 (with or without S12) is opened the current loop of L51 becomes closed by D53, C54 and D52, which will cause energy stored in L51 to be transferred back to C54 via diodes D52 and D53.

Switches S13 and S14 can operate independently and the voltage on output 16 can be other than 0V The main advantage of the invention is to eliminate the need for a high voltage source and a high voltage pulsing unit to supply output port 16. The only extra high voltage element is a rectifying component D11 which is used to charge the energy storage component C11. Everything else to supply load 9 are low voltage elements: power source 5, pulsing unit 18 and energy storage component C11.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A pulsing assembly for delivering power to a plasma reactor having a first load between a first plasma reactor input port and a plasma reactor common port and a second load between a second plasma reactor input port and the plasma reactor common port, the pulsing assembly comprising:
   a first pulsing unit comprising:
      a first input port connectable to a first power source,
      a pulsing assembly common port connectable to a ground and/or to the plasma reactor common port,
      a first output port connectable to the first load of the plasma reactor for supplying pulses between the first output port and the pulsing assembly common port, and
      a first high side switch connected to the first input port and the first output port,
   a second pulsing unit comprising:
      a second input port connectable to the first power source or a second power source, and
      a second output port connectable to the second load of the plasma reactor for supplying pulses between the second output port and the pulsing assembly common port, and
   an energy storage component connected between the first pulsing unit and the second pulsing unit.

2. The pulsing assembly according to claim 1, wherein the pulsing assembly is configured to deliver energy from the first input port to the first output port during a first pulsing time period.

3. The pulsing assembly according to claim 1, wherein the energy storage component is connected between the first output port of the first pulsing unit and the second output port of the second pulsing unit.

4. The pulsing assembly according to claim 1, wherein the pulsing assembly is configured to charge the energy storage component with energy during a second pulsing time period.

5. The pulsing assembly according to claim 1, wherein the pulsing assembly is configured to deliver energy from the energy storage component to the second output port during a third pulsing time period.

6. The pulsing assembly according to claim 1, wherein the second pulsing unit comprises a second high side switch connected to the storage energy component and second output port.

7. The pulsing assembly according to claim 6, wherein the first high side switch of the first pulsing unit and the second high side switch of the second pulsing unit are configured to be switched on and/or off in a synchronized manner.

8. The pulsing assembly according to claim 1, further comprising a rectifying component disposed between the energy storage component and the second input port.

9. The pulsing assembly according to claim 1, wherein the pulsing assembly is configured to provide a voltage pulse measured to the pulsing assembly common port and/or the ground at at least one of the first output port and the second output port that is higher than output voltages of the first pulsing unit and the second pulsing unit.

10. The pulsing assembly according to claim 1 wherein the second pulsing unit comprises a second pulsing unit common port connected to the first output port of the first pulsing unit.

11. The pulsing assembly according to claim 1, wherein the first power source and/or the second power source is a DC power source.

12. A pulsing assembly for delivering power to a plasma reactor having a first load between a first plasma reactor input port and a plasma reactor common port and a second load between a second plasma reactor input port and the plasma reactor common port, the pulsing assembly comprising:
  a first pulsing unit comprising:
    a first input port connectable to a first power source,
    a pulsing assembly common port connectable to a ground and/or to the plasma reactor common port,
    a first output port connectable to the first load of the plasma reactor for supplying pulses between the first output port and the pulsing assembly common port, and
    a low side switch connected to the first output port and the pulsing assembly common port,
  a second pulsing unit comprising:
    a second input port connectable to the first power source or a second power source, and
    a second output port connectable to the second load of the plasma reactor for supplying pulses between the second output port and the pulsing assembly common port, and
    an energy storage component connected between the first pulsing unit and the second pulsing unit.

13. The pulsing assembly according to claim 12, wherein the second pulsing unit comprises a second low side switch connected to the second output port and the first output port.

14. A method of supplying power to a plasma reactor having a first load between a first plasma reactor input port and a plasma reactor common port and a second load between a second plasma reactor input port and the plasma reactor common port using a pulsing assembly, the method comprising:
  delivering energy from a first input port to the first load via a first output port of a first pulsing unit of the pulsing assembly during a first pulsing time period,
  charging an energy storage component connected between the first pulsing unit and a second pulsing unit of the pulsing assembly with energy from a power source connected to a second input port of the second pulsing unit during a second pulsing time period, and
  delivering energy from the energy storage component to the second load via a second output port of the second pulsing unit during a third pulsing time period,
  wherein the first pulsing unit of the pulsing assembly comprises a high side switch connected to the first input port and the first output port of the first pulsing unit, wherein the high side switch is configured for controlling the charging the energy storage component or the delivering the energy from the energy storage component.

* * * * *